United States Patent [19]

Grass

[11] Patent Number: 4,912,598

[45] Date of Patent: Mar. 27, 1990

[54] HEAT DISSIPATING ELECTRICAL CONNECTOR JOINING CIRCUIT BREAKER TERMINAL AND PANEL SUPPLY CONDUCTOR

[75] Inventor: William E. Grass, Whitefish Bay, Wis.

[73] Assignee: Eaton Corporation, Cleveland, Ohio

[21] Appl. No.: 356,961

[22] Filed: May 23, 1989

[51] Int. Cl.[4] ................................................ H05K 5/00

[52] U.S. Cl. .................................... 361/363; 361/376; 361/379

[58] Field of Search ............... 361/353, 358, 363, 376, 361/379

[56] References Cited

U.S. PATENT DOCUMENTS 3,317,866 5/1967 Hanafusa ................................ 335/16

4,430,631 2/1984 Forsell et al. .......................... 335/16

4,532,574 7/1985 Reiner et al. ........................ 361/365

4,713,728 12/1987 Raabe et al. ......................... 361/363

*Primary Examiner*—Roy N. Envall, Jr.

*Attorney, Agent, or Firm*—L. G. Vande Zande

[57] ABSTRACT

A narrow width molded case circuit breaker having a current limiting contact arrangement has the line side terminal brought external near the middle of an end wall of the breaker case. A large mass connector bar is loosely affixed to the terminal by a screw passing through openings in each and engaging a threaded sleeve disposed within a counterbore in the connector bar. The sleeve also engages a threaded post on a supply conductor and is rotated by the screw to clamp the connector bar between the supply conductor and terminal, providing an external current path for heat dissipation and increased spacing from the current limiting contacts.

8 Claims, 2 Drawing Sheets

HEAT DISSIPATING ELECTRICAL CONNECTOR JOINING CIRCUIT BREAKER TERMINAL AND PANEL SUPPLY CONDUCTOR

BACKGROUND OF THE INVENTION

This invention relates to narrow width molded case circuit breakers and more particularly to a line, or supply, side electrical connection between the circuit breaker and a supply conductor of a panel to which the circuit breaker is mounted.

A circuit breaker of the type to which this invention relates is described and claimed in U.S. Pat. No. 4,430,631 issued to Kenneth A. Forsell et al, Feb. 7, 1984, and assigned to the assignee of this invention, which patent is incorporated herein by reference. The circuit breaker comprises a molded case which supports a line side terminal to which a stationary contact is affixed and a load side terminal to which a bimetallic element of a trip assembly is affixed. An operator handle is pivotally supported in the case to project externally through a forward, or upper wall. A conductive arm which has a movable contact affixed thereto is pivotally supported from the handle. An over center spring is connected to the movable contact conductive arm and to a pivoted latch lever to effect either automatic separation of the contacts by the latch lever and trip assembly or selective manual closing or separation of the contacts by movement of the operator handle.

A current path exists through the circuit breaker from the line side terminal, through the stationary and movable contacts, the conductive arm, a flexible braided conductor connected between the conductive arm at one end and the bimetal element at its opposite end, through the bimetal element to the load side terminal. Overload currents of a first predetermined magnitude flowing through the circuit breaker heat the bimetal element, causing it to deflect away from the latch lever, releasing the lever and causing the spring to move over center and effect separation of the contacts. Overload currents of a second predetermined magnitude, greater than the first, generate an electromagnetic field about the bimetal element, which field attracts an armature, causing it to move away from and release the latch lever for contact separation as described hereninabove. A third predetermined level of overload current, higher than each of the previously mentioned levels, causes contact separation in a current limiting mode. The stationary contact is affixed to the lower end of a straight internal portion of the line side terminal. The movable contact conductive arm is disposed within the case in close parallel proximity, coextensive with the straight portion of the line side terminal when the stationary and movable contacts are engaged. The current path in the line side terminal and the conductive arm are oppositely directed and therefore generate repelling electromagnetic forces, causing the movable contact conductive arm to move away from the line side terminal and stationary contact upon the occurrence of high fault current conditions, such movement occurring independently of the operating mechanism or the latch mechanism.

In circuit breakers such as that disclosed in U.S. Pat. No. 4,430,631, the line side terminal is essentially an inverted U-shaped member with an exiting leg extending downwardly within the casing parallel to the straight portion on which the stationary contact i mounted and exits the casing at a lower corner. The external portion of the terminal is provided with a captive nut for bolted connection to a supply bus conductor. The material thickness and irregular structural formation of the exiting portion of the line side terminal portion establishes an electrical resistance which creates a significant voltage drop and tends to generate heat in addition to heat that is already generated within the current carrying parts of the circuit breaker. Moreover, the general direction of the current path within this exiting portion of the line side terminal is opposite and parallel to the current path in the straight portion to which the stationary contact is affixed. Thus current flow in the exiting portion creates an electromagnetic field which, due to its proximity to the movable contact conductive arm and the straight portion of the line side terminal, tends to negate or cancel the repelling electromagnetic fields gènerated within the conducting paths of the stationary contact and movable contact conductive arm.

SUMMARY OF THE INVENTION

To improve the dissipation of heat from within a circuit breaker, a line side terminal is brought externally of the case through an end wall at an upper end of the straight portion to establish a spacing between a panel supply conductor and the terminal. An electrically conductive bar of substantial mass is provided as an electrical connector between the line side terminal and the panel supply conductor to absorb heat from the interior of the circuit breaker, reduce the voltage drop of the circuit breaker and enhance the dissipation of heat from the surface of the electrical connector. Additionally, by bringing the line side terminal directly out the end well of the circuit breaker case, the current path which is parallel to the interior straight portion of the line side terminal bearing the stationary contact is spaced from the straight portion to reduce the cancellation affect on the electromagnetic fields in the two contact current paths. The electrical bar connector is provided with an end-to-end through-hole, counter-bored at one end to an enlarged diameter, to receive an internally threaded sleeve loosely disposed within the counterbore. A locking type screw, such as a screw having an interference fit thread, is inserted through a hole in the line side terminal and the smaller opening of the connector bar to threadably engage the internally threaded sleeve to a point where the sleeve becomes rotatably locked to the screw. The other en of the sleeve engages an upstanding threaded post on the panel supply conductor, the sleeve rotating with the screw so as to thread down upon the post and tightly clamp the connector bar end-to-end between the panel supply conductor and the line side terminal of the circuit breaker. A more complete understanding of the invention and its advantages will be had from the following description and claims when read in conjunction with the accompanying drawings.

DESCRIPTION OF THE PREFERRED EMBODIMENT

Figure 1:
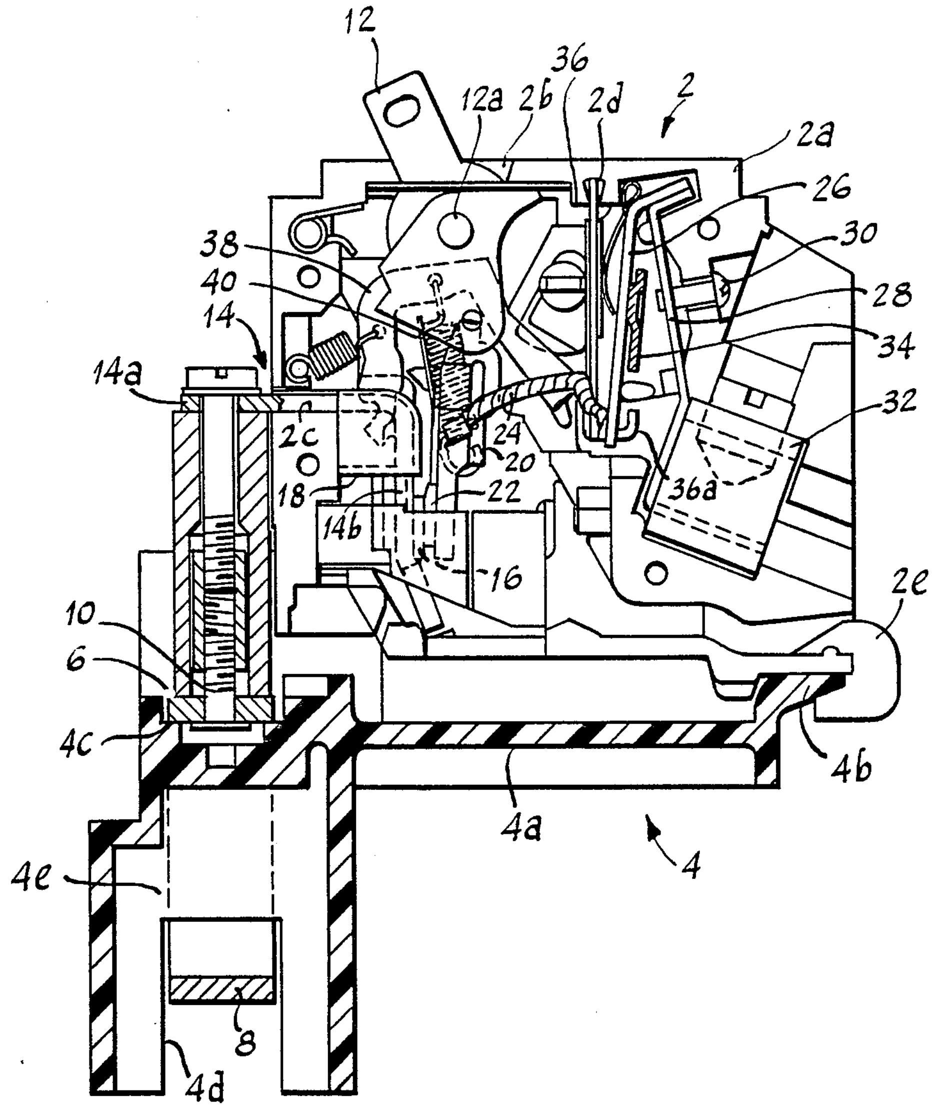
FIG. 1 is a side view of a circuit breaker with a cover portion of the case removed and the pane and the connector bar of this invention shown in cross section.

Referring to FIG. 1, a circuit breaker 2 of the type disclosed in aforementioned U.S. Pat. No. 4,430,631 is shown attached to an insulating circuit breaker support panel 4 of the type utilized in an electric meter center such as that disclosed and claimed in U.S. Pat. No. 4,532,574 issued July 30, 1985 to Richard A. Reiner et al, assigned to the assignee of this invention, and incorporated herein by reference. The insulating circuit breaker support panel 4 is attached to the cabinet of the electric meter center to project away from a wall thereof and provide a panel portion **4*a* which terminates in an outwardly projecting mounting rail 4*b* at the right-hand end thereof as viewed in FIG. 1. The left-hand end of panel portion 4*a* is provided with a support surface 4*c* for a supply or line conductor 6. Although not specifically shown in FIG. 1, the insulating circuit breaker support panel 4 has provisions for accommodating two circuit breakers 2 or a double pole circuit breaker arrangement. To this end, a second incoming line or supply conductor 8 can be seen to extend below conductor 6 through a slot 4*d* in support panel 4 to the opposite side of a rib 4*e*, whereat it extends upward or forward to a support surface coplanar with surface 4*c*. Conductor 6 is provided with an upstanding threaded post 10 which has a flanged lower end abutting the lower surface of conductor 6 and has a shank portion extending through a hole in the conductor. Post 10 may be affixed to conductor 6 by swaging, press fit or the like, and a similar post is affixed to conductor 8**.

Circuit breaker 2 comprises a split molded case, a cover portion of which is removed in FIG. 1. The base and cover (not shown) of case **2*a* have internal cavities suitably configured to position and interlock the various elements of the circuit breaker in proper positions. In particular, an operator handle 12 has a pair of integral trunions 12*a* (only one is shown) which are received in complementally formed recesses (not shown) in case 2*a* and the cover to journal the operator handle 12 for limited rotation to and fro within an opening 2*b* in case 2*a*** and a corresponding opening in the cover.

Figure 2:
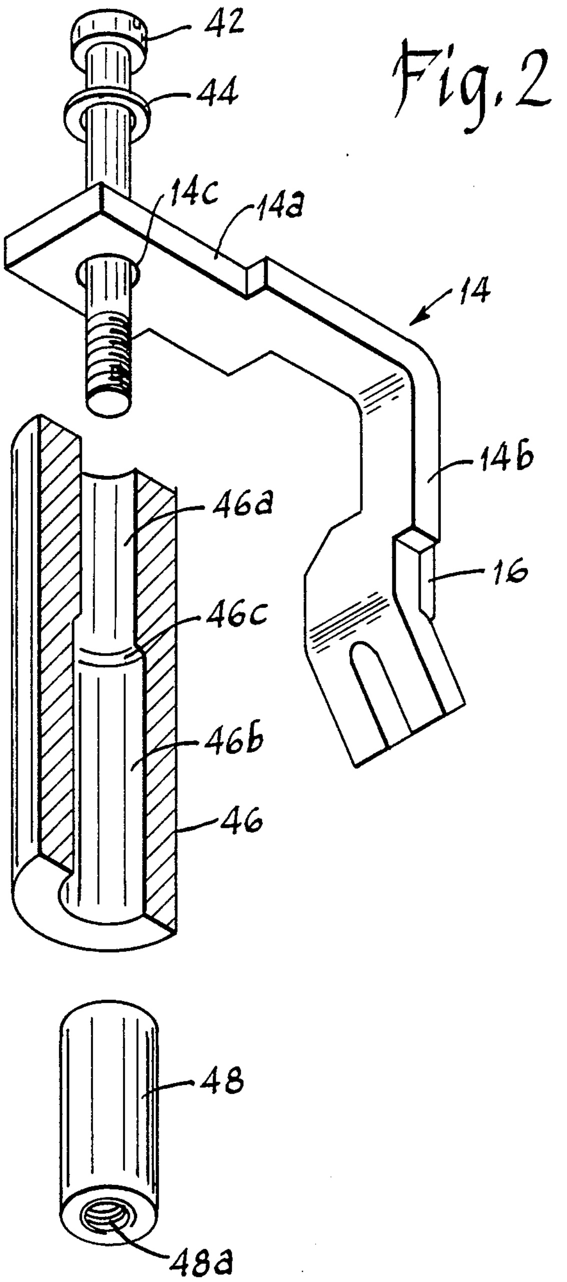
FIG. 2 is an exploded isometric view of the connector bar assembly of this invention.

A line side terminal 14 of this invention is an L-shaped member disposed in an inverted position in case **2*a*. A horizontal leg 14*a* of terminal 14 extends through an opening 2*c* in the end wall of case 2*a*. As seen in FIG. 2, the rear edge of terminal 14 is stepped at 14*b* and 14*c* to correspond with formations in case 2*a* to interlock terminal 14 against movement within the case when the cover is attached thereto. Terminal 14 has a vertically disposed leg 14*b* to which a stationary contact 16 is affixed such as by welding or the like near the lower end of a straight portion thereof. An insulating cap 18 is disposed over terminal 14** at the junction of the horizontal and vertical legs to prevent damage to the terminal by an arc drawn upon separation of the contacts.

A movable contact assembly comprising a Y-shaped conductive arm 20 (shown edgewise in FIG. 1), is pivotally supported on handle operator 12 by out-turned ears **20*a* at the distal ends of the upper extremities of the Y-shaped arm. A movable contact 22 is affixed to the lower end of the stem of Y-shaped conductive arm 20. Conductive arm 20 is disposed to be essentially parallel to the straight portion of vertical leg 14*b* of terminal 14 when the contacts 18, 22 are in the closed position. A flexible braided conductor 24 is welded at one end thereof to conductive arm 20 and at the other end thereof to the lower end of a bimetal element 26 which is part of a thermal and magnetic overcurrent trip mechanism. Bimetal 26 is supported in the case 2*a* by a load side terminal conductor 28 which is held in place by a calibrating screw 30. A pressure connector lug 32 is affixed to the end of load side terminal conductor 28. A shallow U-shaped pole piece 34 is affixed to bimetal element 26 by welding or the like, the opposite legs of pole piece 34 extending around opposite edges of bimetal element 26. An armature 36 is pivotally supported at its upper end within a recess 2*d* in case 2*a* in a corresponding recess in the cover. Armature 36 has a hook portion 36*a* which extends around an edge to the opposite side of bimetal element 26 to be engaged by the bimetal element 26 when the same deflects under a predetermined overcurrent condition to pivot the armature 36 counter-clockwise. Armature 36 has a latching surface (not shown) which is engaged in a set position of the circuit breaker 2 by the right-hand end of an inverted U-shaped latch lever 38. The bight portion of latch lever 38 serves as an anchor point for an over center drive spring 40, the other end of which is connected to the Y-shaped movable contact conductive arm 20** at the juncture of the stem and upper extremities thereof to supply power to the operating mechanism of the breaker.

A current path exists through the circuit breaker 2 from the line side connector 14, stationary contact 16, movable contact 22, conductive arm 20, flexible braided connector 24, bimetal element 26 and load side terminal conductor 28. In a well known manner, when the current flowing through circuit breaker 2 reaches a first predetermined overload current level, bimetal element 26 heats up and in so doing, deflects counterclockwise about its juncture with load side terminal conductor 28, thereby engaging hook **36*a* to pull armature 36 clockwise, releasing latch lever 38 to pivot clockwise about its pivot at the lower end of its left-hand leg. Clockwise movement of latch lever 38 carries the upper end of drive spring 40 over center of the plane of conductive arm 20 to effect separation of movable contact 22 from stationary contact 16. This separation can also be accomplished by manual movement of operator handle 12 wherein the upper end of conductive arm 20 is carried over center of drive spring 40** by appropriate pivotal movement of the handle.

Overload current of a second predetermined magnitude flowing through bimetal 26 generates an electromagnetic flux in pole piece 34 which attracts armature 36 thereto, thereby moving armature 36 electromagnetically in the counterclockwise direction to release the right-hand end of inverted U-shaped latch lever 38 to effect separation of the contacts as aforedescribed. A third predetermined level of overload current causes the circuit breaker movable contact 22 to separate from the stationary contact 16 independently of release of the latch mechanism or of the operating mechanism controlled by handle 12. As can be seen in FIG. 1, the straight through portion of vertical leg **14*b* of terminal 14 is coextensive for a substantial distance with the closely spaced, parallel movable conductive arm 20. The previously described current path in the circuit breaker disclosed current flow downward in the vertical leg 14*b* of terminal 14 and upward in the conductive arm 20**, thereby establishing closely spaced, parallel and oppositely directed current paths in these two members. Fault currents of the third predetermined magnitude generate electromagnetic fields around these conductors which repel each other, and therefore repel movable contact 22 and movable contact arm 20 away from terminal 14 against the bias of drive spring 40 to limit the peak let-through current upon overload fault.

The electrical connector arrangement of this invention is shown in FIGS. 1 and 2. Terminal 14 is brought externally of case 2*a* through an end wall as aforementioned, and in so doing is spaced substantially above supply conductor 6. Terminal 14 is provided with an opening 14*c* which is disposed in axial alignment with upstanding threaded post 10. A connector 46 formed from solid copper bar stock or the like is cut to a length equal to the spacing between conductor 6 and terminal leg 14*a*. A hole 46*a* is formed axially through the center thereof end-to-end. Hole 46*a* has a counterbore 46*b* extending upwardly from the lower end of bar connector 46 to provide a shouldered surface 46*c* internally of bar connector 46. A screw 42 having a washer 44 thereon is inserted through opening 14*c* in terminal 14 and through opening 46*a* in bar connector 46 to extend into counterbore 46*b*. A cylindrical sleeve 48, having an internally threaded opening 48*a* extending axially therethrough, is inserted into counterbore 46*b* for threaded engagement with screw 42. Sleeve 48 projects out the lower end of bar connector 46 during initial engagement of screw 42 with the internally threaded opening 48*a* and may be held while screw 42 is turned into sleeve 48. It is preferable that the threaded engagement between screw 42 and sleeve 48 be a self locking engagement wherein screw 42 penetrates only to a predetermined depth of sleeve 48. This could also be accomplished by providing a shoulder or blind tapped hole in sleeve 48, but is more readily accomplished by providing a screw 42 having an interference fit thread formation with respect to the internally threaded opening 48*a*. Such engagement of screw 42 with sleeve 48 retains connector bar 46 loosely attached to terminal 14 because of engagement of sleeve 48 with shouldered surface 46*c*.

Circuit breaker 2 is attached to the support panel 4 by engaging a hook 2*e*, molded to case 2 at the lower right-hand corner thereof, with mounting rail 4*b* of support panel 4 and pivoting the left-hand end of circuit breaker 2 counter-clockwise wherein sleeve 48 engages the upper end of threaded post 10. Sleeve 48 moves further within counterbore 46*b* as breaker 2 is positioned on the support panel, causing screw 42 to project above the upper end of bar connector 46. Sleeve 48 is rotated to threadably engage post 10 by turning screw 42, firmly clamping connector bar 46 in an end-to-end relation between terminal 14 and conductor 6

Bar connector 46 is disclosed as a cylindrically shaped rod although it could have square, hexagonal or other cross sectional shapes. The important feature is that bar connector 46 have a cross sectional shape which provides a significant mass of material in proportion to the openings therethrough to serve as a heat sink for heat generated within the breaker, to provide a maximum surface area for dissipation of said heat to the atmosphere and to provide a low resistance current path to reduce or minimize the voltage drop across the circuit breaker. An additional advantage of the external current path provided by bar connector 46 and the specific terminal 14 arrangement exiting an end wall of circuit breaker case 2*a* is that the current path in bar connector 46 is displaced a greater distance from the current paths in vertical terminal leg 14*b* and in movable contact conductive arm 20 than if the terminal 14 were formed in a reverse loop to extend downwardly within the breaker case 2*a* to exit the lower left-hand corner as is customary practice. As described hereinabove, the oppositely directed, parallel, closely spaced current paths in terminal portion 14*b* and conduct arm 20 generate repelling electromagnetic fields. It will be evident that the current path through bar connector 46 will be directed opposite to that in portion 14*b* of terminal 14 and electromagnetic field generated by current in this path will be in opposition to that generated in portion 14*b*, and will be attractive with the field generated in conductive arm 20. Accordingly, the greater distance that this current path can be separated from the current paths in terminal portion 14*b* and conductive arm 20, the less affect the electromagnetic field generated therein will have on those electromagnetic fields directly associated with the circuit breaker contacts which are specifically calculated to provide current limiting separation of the contacts.

The foregoing has described an electrical connector for connecting a circuit breaker to a panel supply conductor wherein the supply side terminal of the circuit breaker exits an end wall of the circuit breaker case and a large mass connector is clamped between the terminal and the supply conductor. Although the invention so described represents the best mode contemplated and preferred embodiment, it is to be understood that it is susceptible of various modifications without departing from the scope of the appended claims.

I claim:

1. In an electrical panel comprising at least one electrical supply conductor having at least one upstanding threaded post and in a molded case circuit breaker attached to said panel, said circuit breaker comprising a molded insulating case, a terminal projecting from said case, a hole in said terminal aligned with said threaded post, a stationary contact connected to said terminal within said case, a movable contact within said case, an operating mechanism connected to said movable contact, an operator handle projecting through a forward wall of said case connected to said operating mechanism within said case, said operator handle being movable to operate said operating mechanism and thereby selectively move said movable contact into and out of engagement with said stationary contact, the improvement comprising an electrically conductive elongated bar having an opening extending end-to-end therethrough, said opening being coaxially enlarged in one end of said bar to provide a shouldered surface internally of said bar, a screw extending through said hole in said terminal and through said opening in said bar threadably engaging an internally threaded sleeve disposed within said enlarged opening, means rotatably locking said screw to said sleeve to effect rotation of said sleeve with said screw, said sleeve threadably engaging said threaded post as said screw is rotated to firmly clamp said bar end-to-end between said terminal and said supply conductor in electrical circuit therewith.

2. The improvement defined in claim 1 wherein said bar comprises a substantial cross section material mass relative to said opening to provide low electrical resistance to current flowing therethrough, thereby minimizing a voltage drop between said terminal and said conductor.

3. The improvement defined in claim 1 wherein said bar comprises a substantial cross section material mass relative to said opening t provide a significant heat absorbing mass connected to said stationary contact.

4. The improvement defined in claim 3 wherein said bar provides a large surface area for dissipating heat from said bar to atmosphere.

5. The improvement defined in claim 1 wherein said terminal projects through an end wall of said case in spaced apart relation to said conductor.

6. The improvement defined in claim 1 wherein said sleeve is larger than said opening and retains said bar loosely assembled to said terminal by threaded engagement of said screw and said sleeve.

7. The improvement defined in claim 6 wherein threads on said screw and in said sleeve comprise an interference fit, thereby rotatably locking said sleeve to said screw.

8. The improvement defined in claim 1 wherein said stationary contact is affixed to a lower end of a portion of said terminal within said case, said movable contact is affixed to a lower end of a conductive arm disposed closely adjacent and parallel to said portion of said terminal when said contacts are engaged, to establish parallel, oppositely directed current paths in said portion of said terminal and said conductive arm, electromagnetic forces generated by current flow in said current paths forcing said movable contact conductive arm away from said portion of said terminal independently of said operating mechanism to limit fault current, and said bar extends downwardly from said terminal parallel to and substantially coextensive with said portion of said terminal, said bar being located a sufficient distance from said portion of said terminal to minimize electromagnetic force cancellation in said portion.

* * * * *